United States Patent
Suematsu et al.

[19]

[11] Patent Number: 6,094,108
[45] Date of Patent: Jul. 25, 2000

[54] UNBALANCE-TO-BALANCE CONVERTER UTILIZING A TRANSISTOR

[75] Inventors: Noriharu Suematsu; Shigeru Sugiyama; Masayoshi Ono; Yoshitada Iyama; Fumimasa Kitabayashi, all of Tokyo, Japan

[73] Assignee: Mitsubishi Denki Kabushiki Kaisha, Tokyo, Japan

[21] Appl. No.: 09/153,329

[22] Filed: Sep. 15, 1998

[30] Foreign Application Priority Data

Apr. 10, 1998 [JP] Japan ................... 10-099529

[51] Int. Cl.[7] .................................. H03H 11/32
[52] U.S. Cl. ........................ 333/25; 327/257; 330/301
[58] Field of Search .................... 333/25, 100, 138; 327/256–259; 330/292, 301; 455/323, 333

[56] References Cited

U.S. PATENT DOCUMENTS 5,039,891  8/1991  Wen et al. ...................... 333/25 X
5,821,815  10/1998  Mohwinkel .................... 330/301 X

FOREIGN PATENT DOCUMENTS

61-285813  12/1986  Japan ...................... 327/257
64-30316  2/1989  Japan .

*Primary Examiner*—Paul Gensler

[57] ABSTRACT

An unbalance-to-balance converter includes an FET and a balanced output adjusting capacitor connected between the source terminal of the FET and an earth conductor. The balanced output adjusting capacitor has a capacitance value equal to a capacitance difference Cpd-Cps between a drain side parasitic capacitance Cpd and a source side parasitic capacitance Cps. This makes it possible to solve a problem involved in a conventional unbalance-to-balance converter in that when the drain side parasitic capacitance Cpd differs from the source side parasitic capacitance Cps, a pair of balanced signals output from the drain terminal and source terminal do not have the same amplitude and are not in complete opposition.

27 Claims, 8 Drawing Sheets

UNBALANCE-TO-BALANCE CONVERTER UTILIZING A TRANSISTOR

BACKGROUND OF THE INVENTION

1. Field of the Invention

The present invention relates to an unbalance-to-balance converter for converting an unbalanced high frequency signal (UHF, microwaves, extreme high frequency, etc.) into a pair of balanced high frequency signals, and a balanced mixer for converting the frequency of the balanced high frequency signals.

2. Description of Related Art

Figure 13:
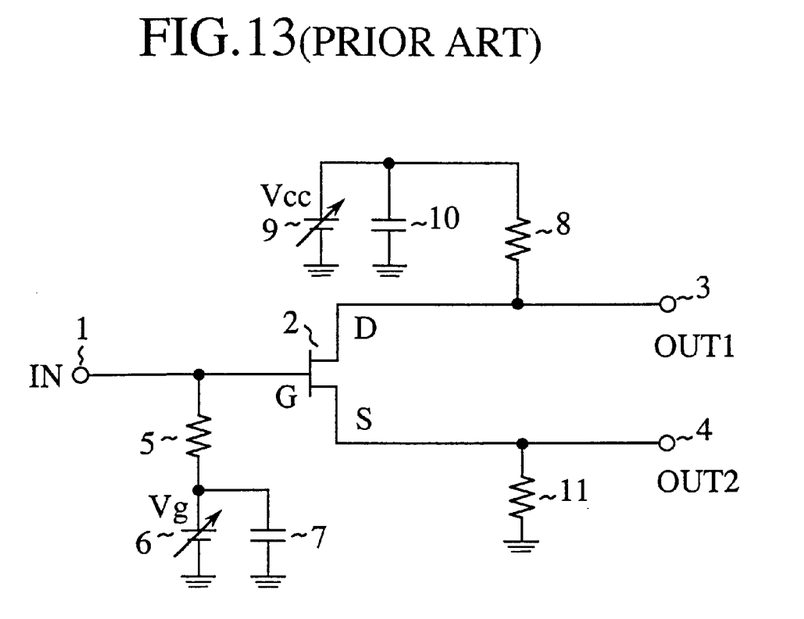
FIG. 13 is a circuit diagram showing a conventional unbalance-to-balance converter.

FIG. 13 is a circuit diagram showing a conventional unbalance-to-balance converter disclosed in Japanese patent application laid-open No. 64-30316/1989, for example. In FIG. 13, the reference numeral 1 designates an input terminal 1 for inputting an unbalanced high frequency signal; 2 designates an FET that outputs, when the unbalanced high frequency signal is supplied to its gate terminal, balanced high frequency signals from its drain terminal and source terminal; 3 and 4 each designate an output terminal for producing one of the balanced high frequency signals; 5 designates a resistor with its first end connected to the gate terminal of the FET 2 and its second end connected to a power supply 6 that supplies a DC voltage; 7 designates a capacitor; 8 designates a resistor with its first end connected to the drain terminal of the FET 2 and its second end connected to a power supply 9 that supplies a DC voltage to the drain of the FET 2; 10 designates a capacitor; and 11 designates a resistor with its first end connected to the source terminal of the FET 2 and its second end connected to an earth conductor.

Next, the operation of the conventional unbalance-to-balance converter will be described.

First, an operational environment of the FET 2 will be described. The gate terminal of the FET 2 is connected to an earth conductor through the resistor 5 and power supply 6 or through the resistor 5 and capacitor 7. In this case, the power supply 6 is regarded as an open circuit and the capacitor 7 as a short circuit because the unbalanced signal applied to the input terminal 1 is a high frequency signal. (The impedance of a capacitor becomes nearly zero when the frequency of an input signal is high enough.) Thus, the load connected to the gate terminal of the FET 2 is assumed to be composed of only the resistor 5 at a high frequency.

On the other hand, the drain terminal of the FET 2 is connected to the earth conductor through the resistor 8 and power supply 9 or through the resistor 8 and capacitor 10. In this case, the power supply 9 is regarded as an open circuit and the capacitor 10 as a short circuit because the balanced signals output from the drain terminal of the FET 2 is a high frequency signal. Thus, the load connected to the drain terminal of the FET 2 is also assumed to be composed of only the resistor 8 at a high frequency.

In such an operational environment, the unbalanced high frequency signal applied to the input terminal 1 is supplied to the gate of the FET 2, and is amplified by the FET 2, so that the balanced high frequency signals are each output from its drain terminal and source terminal. The pair of the balanced high frequency signals are expected to have an identical amplitude and the opposite phases in an ideal case, in which the values of the resistors 8 and 11 are equal.

Figure 14:
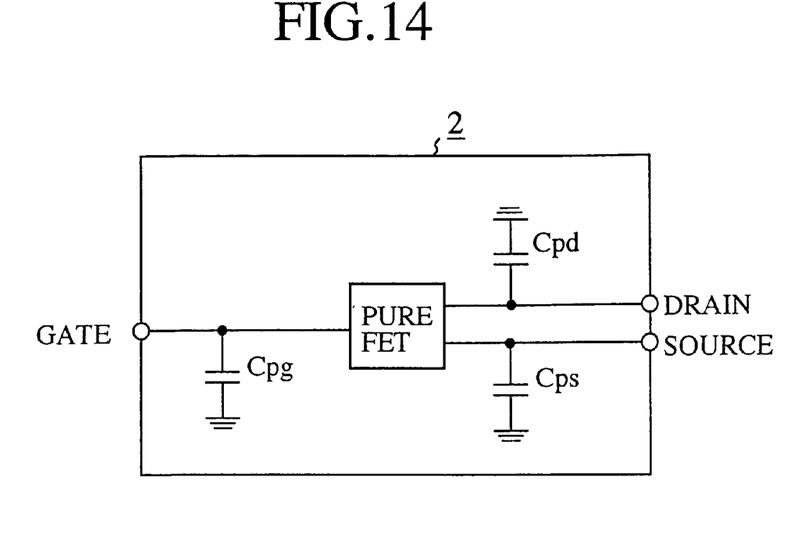
FIG. 14 is a diagram showing an equivalent circuit of an FET.

The drain and source of the FET 2, however, are not symmetrical in their structures, with different electrode areas in general. Thus, the drain side parasitic capacitance Cpd and source side parasitic capacitance Cps usually differ from each other (see, an equivalent circuit of the FET in FIG. 14), and their influence on the high frequency signals output from the drain terminal and source terminal grows with the increase in the difference between them.

More specifically, if the drain side parasitic capacitance Cpd differs from the source side parasitic capacitance Cps, the amplitudes of the two high frequency signals output from the drain terminal and source terminal will be unmatched, and their phases will shift from the complete opposition. Besides, the influence due to the difference between the two capacitances increases with the frequency of the input signal.

Figure 15:
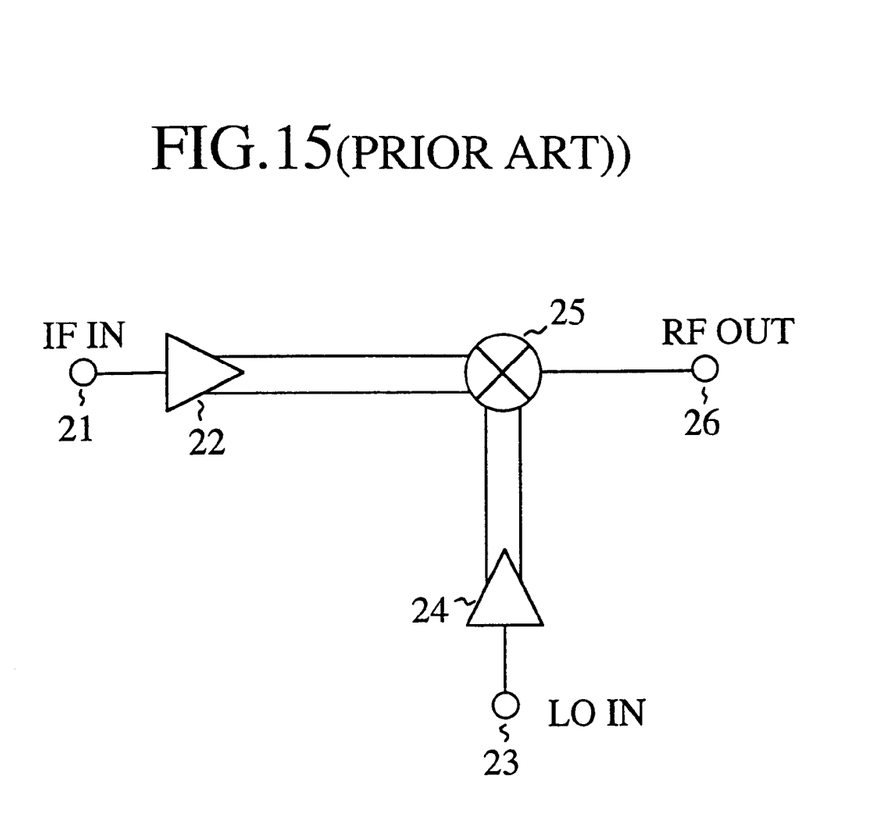
FIG. 15 is a circuit diagram showing a conventional balanced mixer.

FIG. 15 shows a balanced mixer employing conventional unbalance-to-balance converters. An unbalance-to-balance converter 22 outputs balanced mixer input signals by unbalance-to-balance converting an unbalanced mixer input signal applied to an input terminal 21, and an unbalance-to-balance converter 24 outputs balanced local oscillator signals by unbalance-to-balance converting an unbalanced local oscillator signal applied to an input terminal 23. Thus, a mixer 25 is supplied with the balanced mixer input signals and the balanced local oscillator signals, and multiplies (mixes) them with preventing their leakage from an output terminal 26.

In summary, the conventional unbalance-to-balance converter with the foregoing arrangement has a problem in that the balanced signals output from the drain terminal and source terminal differ in amplitude and are not in complete opposition due to the difference between the drain side parasitic capacitance Cpd and source side parasitic capacitance Cps, and this phenomenon grows with an increase of the frequency of the input signal.

Furthermore, the conventional balanced mixer with the foregoing configuration has a problem in that the leakage power of the mixer input signals and local oscillator signals, which is included in the output from the output terminal 26, increases due to the unmatched amplitudes and incomplete opposition of the balanced signals output from the unbalance-to-balance converters 22 and 24.

SUMMARY OF THE INVENTION

The present invention is implemented to solve the foregoing problems. It is therefore an object of the present invention to provide an unbalance-to-balance converter capable of reducing the amplitude difference between the balanced signals output from the drain terminal and source terminal, and capable of placing their phases in nearly complete opposition.

Another object of the present invention is to provide a balanced mixer capable of reducing the leakage power of the local oscillator signal included in its output signal.

According to a first aspect of the present invention, there is provided an unbalance-to-balance converter comprising: a transistor having its gate terminal supplied with an unbalanced input signal, and having its drain terminal and source terminal each produce one of a pair of balanced signals; and at least one reactance component connected between at least one of the drain terminal and source terminal of the transistor and an earth conductor, wherein the capacitance component has a capacitance value equal to a capacitance difference between drain side parasitic capacitance and source side parasitic capacitance.

Here, the capacitance component may be connected between the source terminal and the earth conductor.

The capacitance component may connected between the drain terminal and the earth conductor.

The capacitance component may include an inter-digital capacitor.

The capacitance component may include an open stub.

The capacitance component may consist of a plurality of capacitors connected in parallel.

The capacitance component may include a variable-capacitance semiconductor device.

The variable-capacitance semiconductor device may vary its capacitance value with a bias voltage applied across its terminals.

The at least one capacitance component may comprise a first capacitance component connected between the source terminal and the earth conductor and a second capacitance component connected between the drain terminal and the earth conductor.

According to a second aspect of the present invention, there is provided an unbalance-to-balance converter comprising: a transistor having its gate terminal supplied with an unbalanced input signal, and having its drain terminal and source terminal each produce one of a pair of balanced signals; and at least one inductance component connected between at least one of the drain terminal and source terminal of the transistor and an earth conductor.

Here, the inductance component may be connected between the drain terminal and the earth conductor.

The inductance component may be connected between the source terminal and the earth conductor.

The inductance component may have an inductance value that resonates with a capacitance difference between drain side parasitic capacitance and source side parasitic capacitance of the transistor.

The at least one inductance component may include a first inductance component connected between the drain terminal and the earth conductor and a second inductance component connected between the source terminal and the earth conductor.

A DC voltage applied to at least one of the drain and source may be supplied through the inductance component.

According to a third aspect of the present invention, there is provided a balanced mixer including an unbalance-to-balance converter that comprises: a transistor having its gate terminal supplied with an unbalanced input signal, and having its drain terminal and source terminal each produce one of a pair of balanced signals; and at least one reactance component connected between at least one of the drain terminal and source terminal of the transistor and an earth conductor.

DETAILED DESCRIPTION OF THE PREFERRED EMBODIMENTS

The invention will now be described with reference to the accompanying drawings.

EMBODIMENT 1

Figure 1:
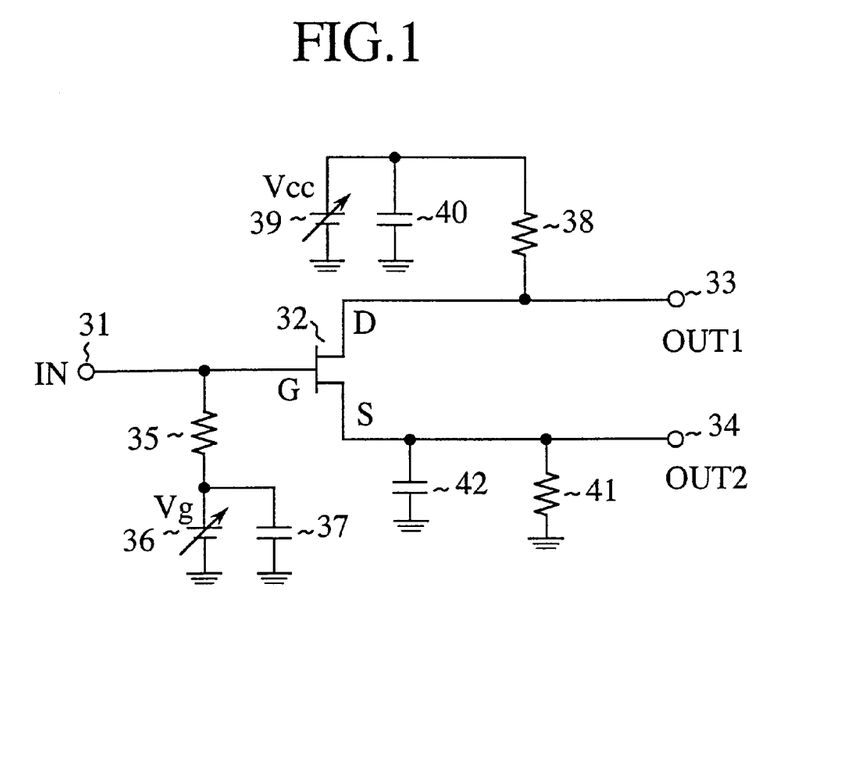
FIG. 1 is a circuit diagram showing an embodiment 1 of an unbalance-to-balance converter in accordance with the present invention.

FIG. 1 is a circuit diagram showing an embodiment 1 of an unbalance-to-balance converter in accordance with the present invention. In FIG. 1, the reference numeral 31 designates an input terminal 31 for inputting an unbalanced high frequency signal; 32 designates an FET that outputs, when the unbalanced high frequency signal is supplied to its gate terminal, a pair of balanced high frequency signals from its drain terminal and source terminal; 33 and 34 each designate an output terminal for producing one of the balanced high frequency signals; 35 designates a resistor with its first end connected to the gate terminal of the FET 32 and its second end connected to a power supply 36 that supplies a DC voltage; 37 designate a capacitor; 38 designates a resistor with its first end connected to the drain terminal of the FET 32 and its second end connected to a power supply 39 for supplying a DC voltage to the drain of the FET 32; 40 designates a capacitor; 41 designates a resistor with its first end connected to the source terminal of the FET 32 and its second end connected to an earth conductor; and 42 designates a balanced output adjusting capacitor with its first end connected to the source terminal of the FET 32 and its second end connected to the earth conductor.

Next, the operation of the present embodiment 1 will be described.

First, an operational environment of the FET 32 will be described. The gate terminal of the FET 32 is connected to the earth conductor through the resistor 35 and power supply 36 or through the resistor 35 and capacitor 37. In this case, the power supply 36 is regarded as an open circuit and the capacitor 37 as a short circuit because the unbalanced signal applied to the input terminal 31 is a high frequency signal. (The impedance of a capacitor becomes nearly zero when the frequency of an input signal is high enough.) Thus, the load connected to the gate terminal of the FET 32 is considered to be composed of only the resistor 35 at a high frequency.

On the other hand, the drain terminal of the FET 32 is connected to the earth conductor through the resistor 38 and power supply 39 or through the resistor 38 and capacitor 40. In this case, the power supply 39 is regarded as an open circuit and the capacitor 40 as a short circuit because the balanced signal output from the drain terminal of the FET 32 is a high frequency signal. Thus, the load connected to the drain terminal of the FET 32 is considered to be composed of only the resistor 38 at a high frequency.

In such an environment, the unbalanced high frequency signal is supplied through the input terminal 31 to the gate of the FET 32, and is amplified by the FET 32, and the pair of the balanced high frequency signals are output from its drain terminal and source terminal, respectively. The pair of the balanced high frequency signals are expected to have an identical amplitude and the opposite phases in an ideal case in which the values of the resistors 38 and 41 are equal.

The drain and source of the FET 32, however, are not symmetrical in their structures, with different electrode areas in general. Thus, the drain side parasitic capacitance Cpd and source side parasitic capacitance Cps usually differ from each other (see, the equivalent circuit of the FET in FIG. 14), and their influence on the high frequency signals output from the drain terminal and source terminal grows with the increase in the difference between them.

More specifically, if the drain side parasitic capacitance Cpd differs from the source side parasitic capacitance Cps, the amplitudes of the two high frequency signals output from the drain terminal and source terminal become unmatched, and their phases shift from the complete opposition. Besides, the influence due to the difference between the two parasitic capacitances increases with the frequency of the input signal.

In view of this, the present embodiment 1 connects between the source terminal and the earth conductor the balanced output adjusting capacitor 42 having a capacitance equal to the capacitance difference Cpd-Cps between the drain side parasitic capacitance Cpd and source side parasitic capacitance Cps when the former is greater than the latter.

This enables the capacitance difference Cpd-Cps between the drain side parasitic capacitance Cpd and source side parasitic capacitance Cps to be cancelled, and the amplitudes of the high frequency signals output from the drain terminal and source terminal closely agree with each other, and their phases approach the complete opposition.

It is preferable that the balanced output adjusting capacitor 42 be connected in the vicinity of the FET 32. This is because the balanced output adjusting capacitor 42 seen from the FET 32 must be a pure capacitance in order to cancel the parasitic capacitance of the FET 32, and this condition is satisfied only when the distance between the FET 32 and balanced output adjusting capacitor 42 is close, and hence the inductance between them can be neglected. Accordingly, the balanced output adjusting capacitor 42 and the FET 32 are preferably formed on the same semiconductor chip. For example, the entire unbalance-to-balance converter of FIG. 1 is formed in the same semiconductor chip.

As described above, the embodiment 1 is arranged such that the balanced output adjusting capacitor 42 is connected between the source terminal of the FET 32 and the earth conductor, the balanced output adjusting capacitor 42 having a capacitance equal to the capacitance difference Cpd-Cps between the drain side parasitic capacitance Cpd and source side parasitic capacitance Cps. This offers an advantage of being able to reduce the amplitude difference between the high frequency signals output from the drain terminal and source terminal, and to achieve the almost complete opposition of their phases.

EMBODIMENT 2

Figure 2:
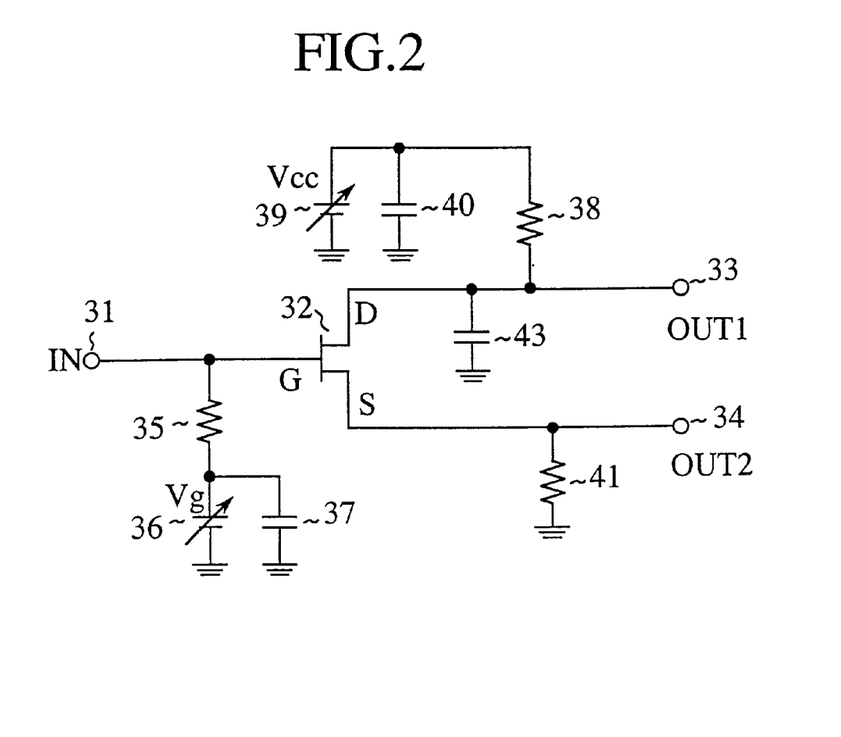
FIG. 2 is a circuit diagram showing an embodiment 2 of the unbalance-to-balance converter in accordance with the present invention.

Although the foregoing embodiment 1 handles the case where the FET 32 is used in which the drain side parasitic capacitance Cpd is greater than the source side parasitic capacitance Cps, the FET 32 can also be used whose source side parasitic capacitance Cps is greater than the drain side parasitic capacitance Cpd. This can be implemented as shown in FIG. 2 by connecting between the drain terminal and the earth conductor a balanced output adjusting capacitor 43 having a capacitance equal to the capacitance difference Cps-Cpd between the source side parasitic capacitance Cps and drain side parasitic capacitance Cpd.

According to the present embodiment 2, the capacitance difference Cps-Cpd between the source side parasitic capacitance Cps and drain side parasitic capacitance Cpd is canceled, resulting in closely matched amplitude and almost complete opposition of the high frequency signals output from the drain terminal and source terminal.

EMBODIMENT 3

Although the balanced output adjusting capacitor 42 is connected between the source terminal and the earth conductor, and the balanced output adjusting capacitor 43 is connected between the drain terminal and the earth conductor in the foregoing embodiments 1 and 2, respectively, the balanced output adjusting capacitors 42 and 43 can be each replaced with an inter-digital capacitor.

Figure 3:
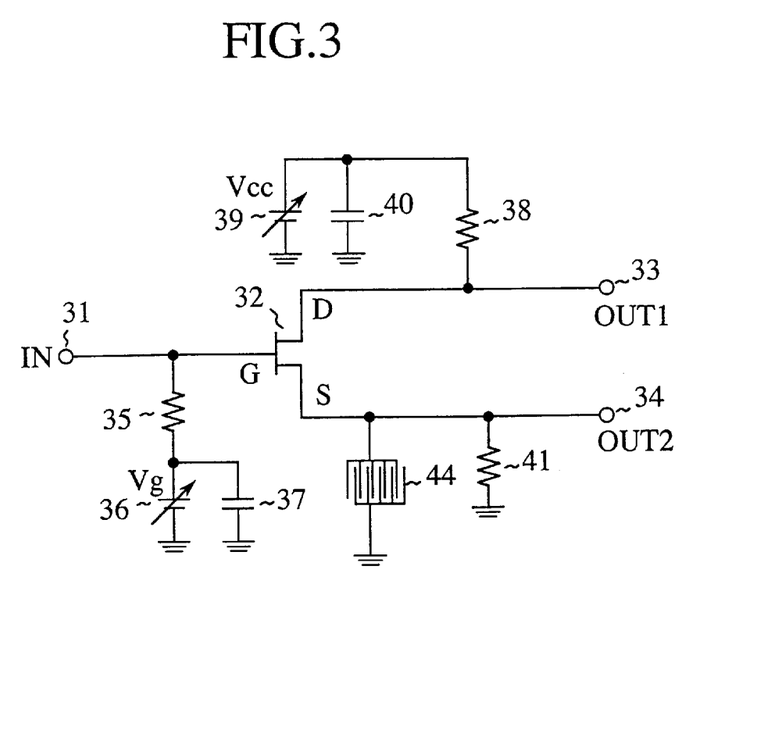
FIG. 3 is a circuit diagram showing an embodiment 3 of the unbalance-to-balance converter in accordance with the present invention.

More specifically, when the FET 32 is used whose drain side parasitic capacitance Cpd is greater than the source side parasitic capacitance Cps, an inter-digital capacitor 44 is connected between the source terminal and the earth conductor as shown in FIG. 3, but when the FET 32 is used whose source side parasitic capacitance Cps is greater than the drain side parasitic capacitance Cpd, the inter-digital capacitor 44 is connected between the drain terminal and the earth conductor. Since the inter-digital capacitor 44 consists of a coupling capacitance between two closely disposed conductive patterns, the product variation of the capacitance can be reduced to a very small value if the accuracy of the patterns is kept high enough.

Although the inter-digital capacitor 44 cannot implement a large capacitance, since the capacitance difference Cpd-Cps between the parasitic capacitances of the FET 32 is usually very small in a range from 0.1 pF to 1 pF, it can be implemented by the inter-digital capacitor 44.

Thus, using the inter-digital capacitor 44 enables the product variation to be reduced to a very small value, resulting in a high degree of matching between the amplitudes of the two high frequency signals, and the almost complete opposition thereof.

EMBODIMENT 4

Although the inter-digital capacitor 44 is connected in place of the balanced output adjusting capacitor 42 or 43, it can be replaced with an open stub.

Figure 4:
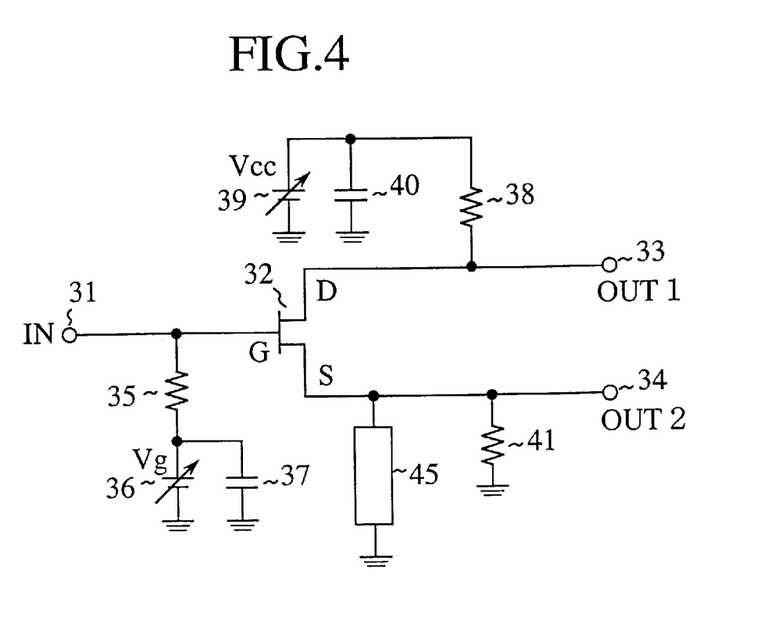
FIG. 4 is a circuit diagram showing an embodiment 4 of the unbalance-to-balance converter in accordance with the present invention.

More specifically, when the FET 32 is used whose drain side parasitic capacitance Cpd is greater than the source side parasitic capacitance Cps, an open stub 45 is connected between the source terminal and the earth conductor as shown in FIG. 4, but when the FET 32 is used whose source side parasitic capacitance Cps is greater than the drain side parasitic capacitance Cpd, the open stub 45 is connected between the drain terminal and the earth conductor. The open stub 45 is composed of a strip conductor formed on a dielectric substrate, and an earth conductor on the bottom surface of the substrate. Thus, the product variation of its capacitance can be reduced to a very small value if the thickness of the substrate is kept sufficiently accurate.

Although the open stub 45 has a problem of being unable to implement a large capacitance, since the capacitance difference Cpd-Cps between the parasitic capacitances of the FET 32 is usually very small in a range from 0.1 pF to 1 pF, it can be implemented by the open stub 45.

Thus, using the open stub 45 enables the product variation to be reduced to a very small value, resulting in a high degree of matching between the amplitudes of the two high frequency signals, and the almost complete opposition thereof.

EMBODIMENT 5

Although the balanced output adjusting capacitor 42 is connected between the source terminal and the earth conductor, and the balanced output adjusting capacitor 43 is connected between the drain terminal and the earth conductor in the foregoing embodiments 1 and 2, respectively, the balanced output adjusting capacitors 42 and 43 can be each replaced with a plurality of MIM (metal-insulator-metal) capacitors.

Figure 5:
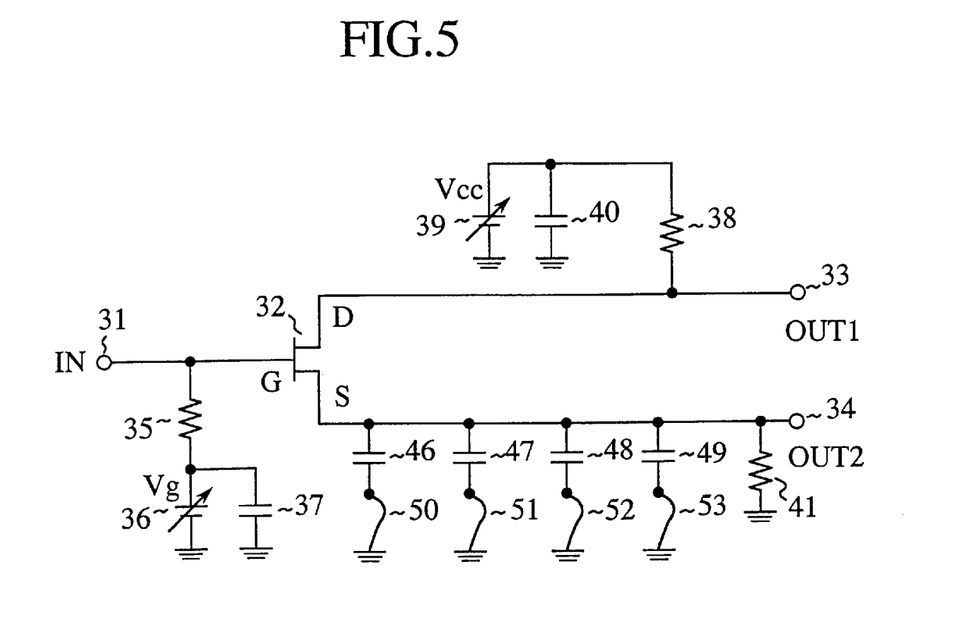
FIG. 5 is a circuit diagram showing an embodiment 5 of the unbalance-to-balance converter in accordance with the present invention.

More specifically, when the FET 32 is used whose drain side parasitic capacitance Cpd is greater than the source side parasitic capacitance Cps, MIM capacitors 46–49 are disposed such that their first ends are connected to the source terminal of the FET 32, and their second ends are grounded through connecting wires 50–53 as shown in FIG. 5. On the other hand, when the FET 32 is used whose source side parasitic capacitance Cps is greater than the drain side parasitic capacitance Cpd, the MIM capacitors 46–49 are disposed such that their first ends are connected to the drain terminal of the FET 32, and their second ends are grounded through the connecting wires 50–53.

The MIM capacitors 46–49 are widely employed as capacitance elements that are formed on an IC substrate like a GsAs-MMIC (monolithic microwave integrated circuit). Since the product variation of their capacitance is due to the thickness of their insulator which is rather large, the product variation of the capacitance is greater than that of the inter-digital capacitor 44 or open stub 45, which depends on the pattern accuracy. Generally, not only the MIM capacitor, but also the capacitance elements like a chip capacitor, which are fabricated using a dielectric film, have a larger product variation because of the same reason.

To overcome the product variation, the MIM capacitors 46–49 are connected in parallel to the source terminal in the present embodiment 5, so that the sum total of the capacitors can be adjusted by changing the connection state of the connecting wires 50–53. More specifically, some of the connecting wires 50–53, which are all connected at first, are severed watching the electric performance to adjust the sum total of the capacitors. This method can reduce a work time because the wire connection can be completed at once. The sum total of the MIM capacitors 46–49 must be set greater than a design value considering the product variation.

Although the capacitance is adjusted by changing the connection state of the MIM capacitors 46–49 in the above-mentioned example, the same effect can be achieved by using instead of the connecting wires any connecting means whose connection state can be changed with ease. For example, leads or metal patterns on a packaging substrate or an IC can also be used. In addition, when using wiring on the top layer of the packaging substrate or IC, the severing can be readily carried out if the passivation at portions to be cut is removed in advance. Furthermore, when changing the wiring by altering the pattern mask, the change can be achieved more easily when the wiring is formed on the top layer. Moreover, when the capacitance consists of chip capacitors on the packaging substrate, the capacitance adjustment can be carried out by adjusting the number or types of chip components.

According to the present embodiment 5, the capacitance is composed of a plurality of the MIM capacitors connected in parallel. This offers an advantage of being able to adjust the sum total of the capacitors with ease.

EMBODIMENT 6

Figure 6:
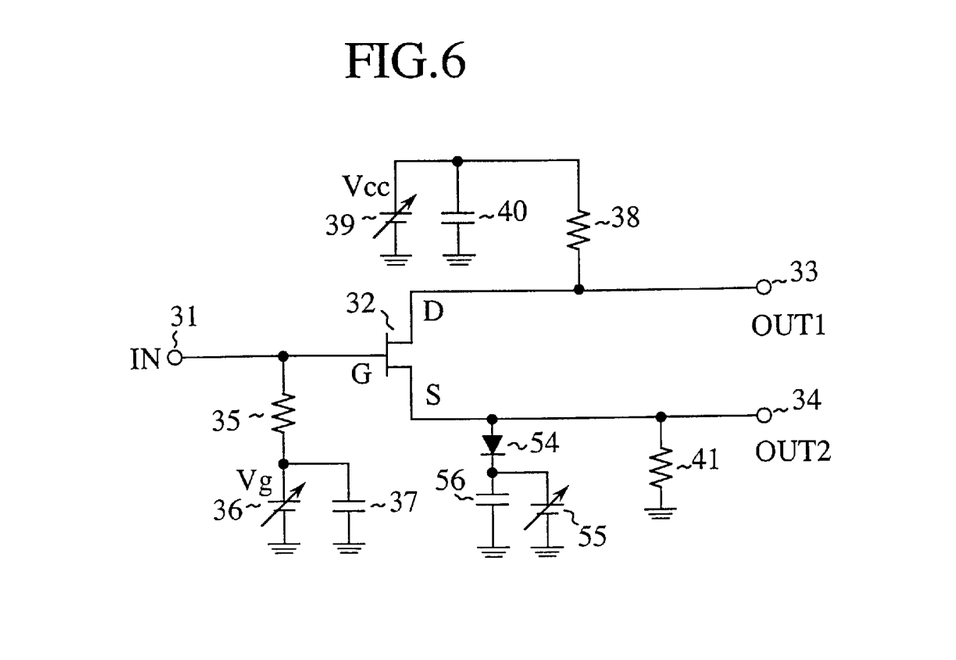
FIG. 6 is a circuit diagram showing an embodiment 6 of the unbalance-to-balance converter in accordance with the present invention.

FIG. 6 is a circuit diagram showing an embodiment 6 of the unbalance-to-balance converter in accordance with the present invention, in which the same reference numerals designate the same or corresponding portions to those of FIG. 1, and the description thereof is omitted here.

In FIG. 6, the reference numeral 54 designates a varactor whose capacitance varies with a bias voltage applied across its terminals; 55 designates a power supply for applying the bias voltage across the terminals of the varactor 54; and 56 designates a DC cut capacitor.

Next, the operation of the present embodiment 6 will be described.

First, the operational environment of the FET 32 will be described. Although the source terminal of the FET 32 is connected to the earth conductor through the varactor 54 and power supply 55 or through the varactor 54 and DC cut capacitor 56, the power supply 55 is regarded as an open circuit, and the DC cut capacitor 56 as a closed circuit at a high frequency because the balanced signal output from the source terminal of the FET 32 is a high frequency signal.

When the unbalanced high frequency signal is input to the gate of the FET 32 via the input terminal 31 in such an operational environment, a pair of the balanced high frequency signals are output from the drain terminal and source terminal of the FET 32. In this case, the capacitance difference Cpd-Cps between the parasitic capacitances of the FET 32 can be canceled by appropriately adjusting the bias voltage across the varactor 54 because this will change the capacitance of the varactor 54 that operates as the capacitance element.

In addition, the capacitance difference Cpd-Cps between the parasitic capacitances can be canceled, even if it varies owing to the frequency change in the unbalanced signal input to the FET 32, because the capacitance value of the varactor 54 can be varied by adjusting the bias voltage. Forming the FET 32 and varactor 54 on the same substrate makes it possible to avoid additional inductance due to connecting wire between them.

EMBODIMENT 7

Figure 7:
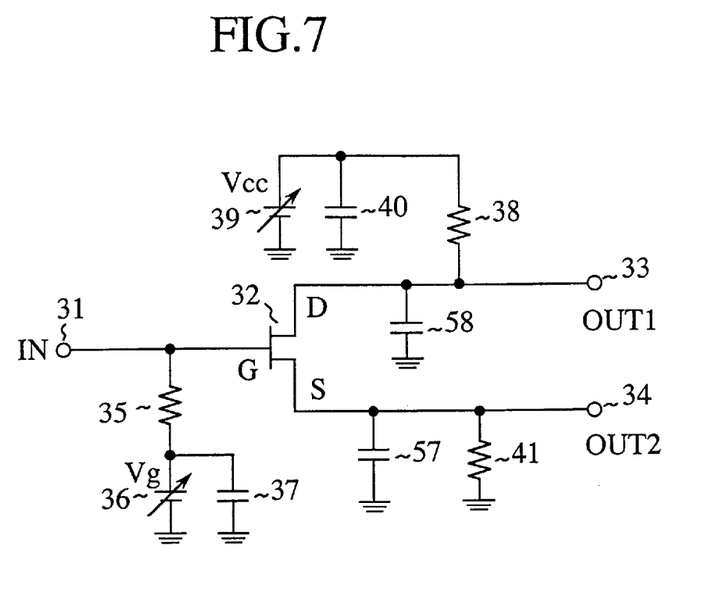
FIG. 7 is a circuit diagram showing an embodiment 7 of the unbalance-to-balance converter in accordance with the present invention.

Although the balanced output adjusting capacitor 42 is connected between the source terminal and the earth conductor in the foregoing embodiment 1, and between the drain terminal and the earth conductor in the embodiment 2, balanced output adjusting capacitors 57 and 58 may be connected between the source terminal and the conductor, and between the drain terminal and the conductor, respectively, as shown in FIG. 7.

When the balanced output adjusting capacitor 42 or 43 is connected to only one of the source terminal and drain terminal, a problem can arise in a case where the product variation is large, in that the amplitudes of the balanced signals do not match, and the complete opposition cannot be achieved.

In contrast with this, in the present embodiment 7, the capacitance difference Cpd-Cps between the parasitic capacitances of the FET 32 is made equal to the capacitance difference between the balanced output adjusting capacitors 57 and 58, which are connected to the source terminal and drain terminal, respectively, and the product variations in the capacitance values of the balanced output adjusting capacitor 57 and 58 can be made nearly equal by forming them at the same time. For example, it is possible for the MIM capacitors on the same substrate, or the chip capacitance arrays integrated in the same chip to have nearly the same variations in the capacitance values with respect to their design values.

In other words, connecting the balanced output adjusting capacitors 57 and 58 to the source terminal and drain terminal, respectively, enables their product variations to be canceled. This offers an advantage of being able to cancel the capacitance difference Cpd-Cps of the parasitic capacitances of the FET 32 more precisely than when the balanced output adjusting capacitor 42 or 43 is connected to only one of the source terminal and drain terminal.

If the capacitance values of the balanced output adjusting capacitors 57 and 58 are large enough compared with the capacitance difference Cpd-Cps between the parasitic capacitances of the FET 32, they can be made equal because the effect due to the capacitance difference Cpd-Cps can be neglected in this case.

EMBODIMENT 8

Figure 8:
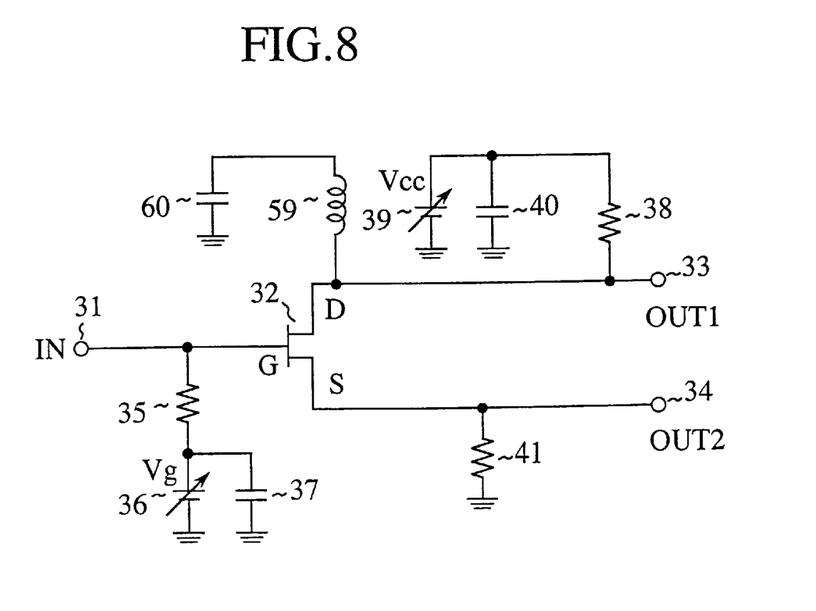
FIG. 8 is a circuit diagram showing an embodiment 8 of the unbalance-to-balance converter in accordance with the present invention.

Although the balanced output adjusting capacitor 42 is connected between the source terminal and the earth conductor in the foregoing embodiment 1, a chip inductor 59 can be connected between the drain terminal and the earth conductor as shown in FIG. 8, in which the reference numeral 60 designates a DC cut capacitor which can be regarded as a short circuit at a high frequency.

Connecting the chip inductor 59 with an inductance value that resonates with the capacitance difference Cpd-Cps between the drain side parasitic capacitance Cpd and source side parasitic capacitance Cps of the FET 32 enables the difference Cpd-Cps to be canceled as in the case of the balanced output adjusting capacitor 42.

Although the chip inductor 59 is used here, a piece of wire or a spiral inductor can achieve a similar effect. In particular, it is possible for a spiral inductor formed on the same chip with the FET 32 to implement more accurate balanced outputs because the manufacturing error due to chip assembly can be avoided.

EMBODIMENT 9

Figure 9:
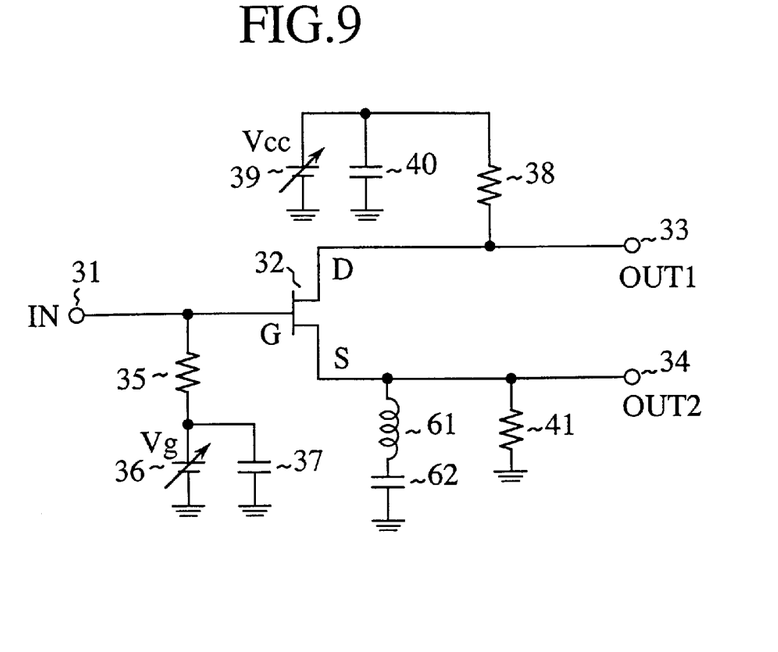
FIG. 9 is a circuit diagram showing an embodiment 9 of the unbalance-to-balance converter in accordance with the present invention.

Although the foregoing embodiment 8 employs the FET 32 whose drain side parasitic capacitance Cpd is greater than its source side parasitic capacitance Cps, it is also possible to use the FET 32 whose source side parasitic capacitance Cps is greater than its drain side parasitic capacitance Cpd by connecting between the source terminal and the earth conductor a chip inductor 61 that resonates with the capacitance difference Cps-Cpd between the source side parasitic capacitance Cps and drain side parasitic capacitance Cpd, which enables the difference Cps-Cpd to be canceled. This makes it possible for the high frequency signals output from the drain terminal and source terminal to achieve the matching of amplitudes, and the complete opposition.

EMBODIMENT 10

Figure 10:
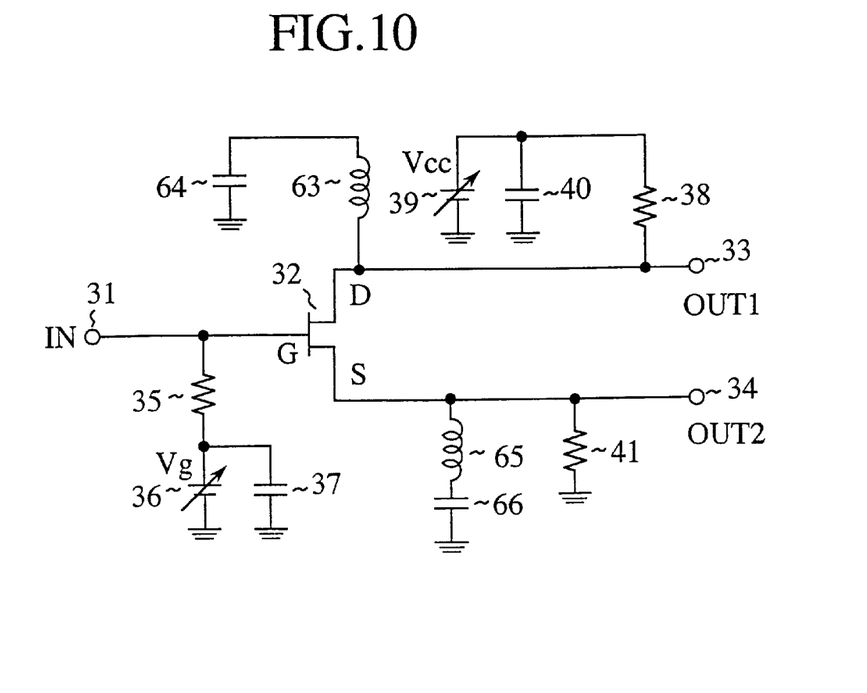
FIG. 10 is a circuit diagram showing an embodiment 10 of the unbalance-to-balance converter in accordance with the present invention.

Although the chip inductor 59 is connected between the drain terminal and the earth conductor in the foregoing embodiment 8, and the chip inductor 61 is connected between the source terminal and the earth conductor in the embodiment 9, chip inductors 63 and 65 can be connected to both the drain terminal and source terminal as shown in FIG. 10. In FIG. 10, reference numerals 64 and 66 each designate a DC cut capacitor which can be regarded as a short circuit at a high frequency.

When connecting the chip inductor 59 or 61 to only one of the drain terminal and source terminal, it sometimes becomes very difficult to form the chip inductor 59 or 61 because a large inductance value is required at a low frequency to implement the resonance with the very small capacitance difference Cpd-Cps between the parasitic capacitances of the FET 32, which ranges from 0.1 pF to 1 pF.

In contrast with this, when the chip inductors 63 and 65 are connected to both the drain terminal and source terminal, it is enough for the chip inductor 63 to have an inductance value that resonates with the drain side parasitic capacitance Cpd, and for the chip inductor 65 to have one that resonates with the source side parasitic capacitance Cps, which have a larger value than the capacitance difference Cpd-Cps. This offers an advantage of being able to facilitate forming the chip inductors 63 and 65 because a rather small chip inductors can meet the resonant condition.

It is not necessary for the chip inductors 63 and 65 to resonate with the parasitic capacitances Cpd and Cps of the FET 32. It is enough that their inductance values are set such that the impedances at the drain terminal and source terminal become equal at the frequency of the balanced signals.

Although the chip inductors 63 and 65 are used in the example above, they can be replaced with wires or spiral inductors, achieving a similar effect. In particular, it is possible for the spiral inductors formed on the same chip with the FET 32 to implement more accurate balanced outputs because the manufacturing error due to chip assembly can be avoided.

EMBODIMENT 11

Figure 11:
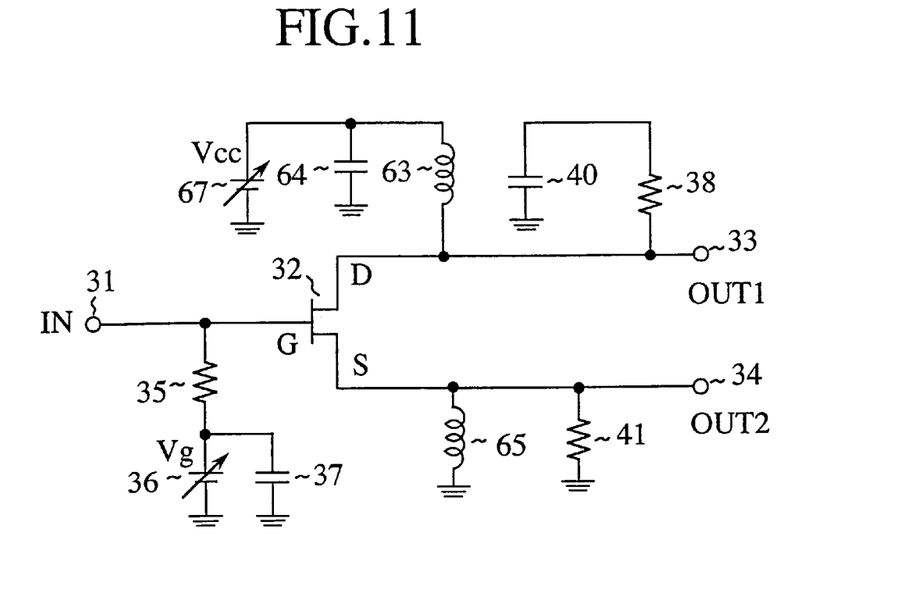
FIG. 11 is a circuit diagram showing an embodiment 11 of the unbalance-to-balance converter in accordance with the present invention.

FIG. 11 is a circuit diagram showing an embodiment 11 of the unbalance-to-balance converter in accordance with the present invention, in which the same reference numerals designate the same or corresponding portions to those of FIG. 10, and the description thereof is omitted here. In FIG. 11, the reference numeral 67 designates a power supply for supplying the drain of the FET 32 with a DC voltage through the chip inductor 63.

Next, the operation of the present embodiment 11 will be described.

First, the operational environment of the FET 32 will be described. In contrast with the foregoing embodiment 10, the present embodiment 11 excludes the DC cut capacitor 66

(see, FIG. 10), so that the chip inductor 65 is grounded direct-currently. Thus, the source of the FET 32 is grounded direct-currently. In addition, since the bias voltage is supplied from the power supply 67 to the drain of the FET 32 through the chip inductor 63, the drain voltage is also applied direct-currently.

In the foregoing embodiment 10, since the bias voltage to the drain is supplied from the power supply 39 through the resistor 38, and the bias voltage to the source is supplied from the power supply 36 through the resistor 41, they are dropped through the resistors 38 and 41. In the present embodiment 11, however, they are supplied from the power supply 67 to the drain through the chip inductor 63, and from the power supply 36 to the source through the chip inductor 65, respectively. This prevents the bias voltages from being dropped.

Thus, the present embodiment 11 can increase the drain-source voltage as compared with the foregoing embodiment 10, when using the same power supplies. This offers an advantage of being able to not only obtain a highly accurate balanced outputs, but also increase saturated output power.

Although the bias voltages are supplied to the drain and source through the chip inductors 63 and 65, respectively, one of the two bias voltages can be supplied through a chip inductor, achieving nearly the same effect.

EMBODIMENT 12

Although the FET 32 is used as a transistor constituting the unbalance-to-balance converter in the foregoing embodiments 1–11, a bipolar junction transistor can also be employed in place of the FET 32. In this case, the drain, source and gate should be read as the collector, emitter and base, respectively.

EMBODIMENT 13

Figure 12:
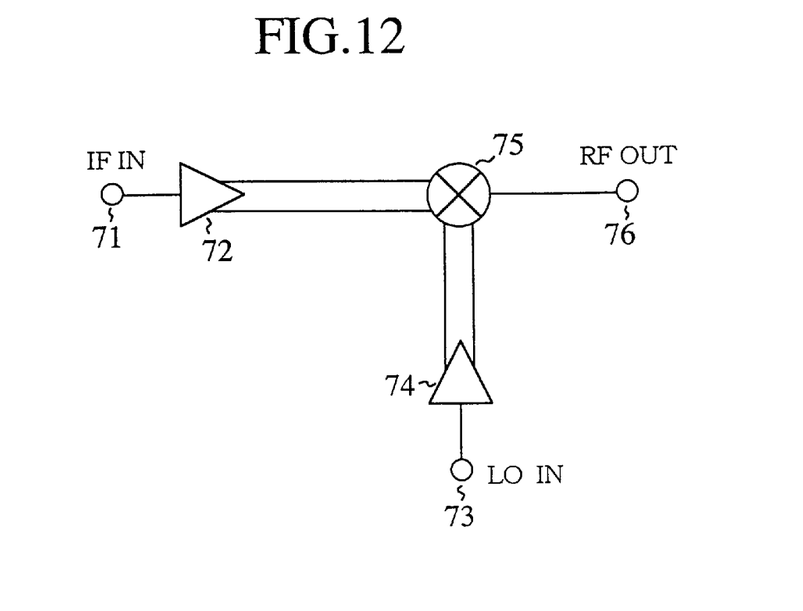
FIG. 12 is a circuit diagram showing an embodiment 13 of balanced mixer in accordance with the present invention.

FIG. 12 is a block diagram showing a balanced mixer of an embodiment 13 in accordance with the present invention. In FIG. 12, the reference numeral 71 designates an input terminal to which a mixer input signal is applied; 72 designates a conventional unbalance-to-balance converter (see, FIG. 13); 73 designates an input terminal to which a local oscillator signal is supplied; 74 designates an unbalance-to-balance converter with its drain terminal or source terminal connected to the capacitance or inductance, that is, one of the unbalance-to-balance converters of the embodiments 1–12; 75 designates a mixer for multiplying the balanced mixer input signals supplied from the unbalance-to-balance converter 72 and the balanced local oscillator signals supplied from the unbalance-to-balance converter 74; and 76 designates an output terminal.

Next, the present embodiment 13 will be described.

When the unbalance-to-balance converter 72 carries out the unbalance-to-balance conversion of the mixer input signal supplied through the input terminal 71 and produces the balanced mixer input signals, and the unbalance-to-balance converter 74 carries out the unbalance-to-balance conversion of the unbalanced local oscillator signal supplied through the input terminal 73 and produces the balanced local oscillator signals, the mixer 75 inputs them in a balanced state, and multiplies the balanced mixer input signals by the balanced local oscillator signals, with preventing these signals from being leaked to the output terminal 76.

If the amplitudes of the balanced signals output from the unbalance-to-balance converters 72 and 74 differ, and the phases thereof shift from the complete opposition, leakage of the mixer input signals and local oscillator signals to the output terminal will increase in its power. Thus, it is necessary for the unbalance-to-balance converters 72 and 74 to increase the accuracy of their balanced outputs in order to inhibit the leakage. In particular, since the local oscillator signal is closer to the high frequency signal in its frequency than the mixer input signal is, the leakage of the former must be more strictly suppressed.

In view of this, the present embodiment 13 employs the conventional unbalance-to-balance converter (see, FIG. 13) as the unbalance-to-balance converter 72, and one of the unbalance-to-balance converters of the foregoing embodiments 1–12, which produces a highly accurate balanced outputs, as the unbalance-to-balance converter 74. This offers an advantage of being able to reduce the leakage power of the local oscillator signal to the output terminal 76.

Although the present embodiment 13 employs the conventional unbalance-to-balance converter as the unbalance-to-balance converter 72, any of the unbalance-to-balance converters can be used as the unbalance-to-balance converter 72. This offers an advantage of being able to reduce the leakage power of the mixer input signals to the output terminal 76.

Any of the unbalance-to-balance converters of the embodiments 1–12 can be employed as the unbalance-to-balance converters 72 and 74, in which case, it is possible to reduce the leakage power of the mixer input signals and local oscillator signals to the output terminal 76.

Although the present embodiment 13 describes a transmitting mixer, a receiving mixer can also be implemented in the same manner, in which case, the mixer input signal and the balanced high frequency signals are read as the balanced high frequency signals and the mixer output signal, respectively.

What is claimed is:

1. An unbalance-to-balance converter comprising:
   a transistor having a gate terminal supplied with an unbalanced input signal, and having a drain terminal and a source terminal which each produce one of a pair of balanced signals; and
   at least one capacitance component connected between at least one of said drain terminal and said source terminal of said transistor and an earth conductor,
   wherein said capacitance component has a capacitance value equal to a difference between drain side parasitic capacitance and source side parasitic capacitance.

2. The unbalance-to-balance converter as claimed in claim 1, wherein said capacitance component is connected between said source terminal and said earth conductor.

3. The unbalance-to-balance converter as claimed in claim 1, wherein said capacitance component is connected between said drain terminal and said earth conductor.

4. The unbalance-to-balance converter as claimed in claim 1, wherein said capacitance component includes an inter-digital capacitor.

5. The unbalance-to-balance converter as claimed in claim 1, wherein said capacitance component includes an open stub.

6. The unbalance-to-balance converter as claimed in claim 1, wherein said capacitance component includes a plurality of capacitors connected in parallel.

7. The unbalance-to-balance converter as claimed in claim 1, wherein said capacitance component includes a variable-capacitance semiconductor device.

8. The unbalance-to-balance converter as claimed in claim 7, wherein said variable-capacitance semiconductor device varies its capacitance value with a bias voltage applied across its terminals.

9. The unbalance-to-balance converter as claimed in claim 1, wherein said at least one capacitance component includes:
   a first capacitance component connected between said source terminal and said earth conductor; and
   a second capacitance component connected between said drain terminal and said earth conductor.

10. An unbalance-to-balance converter comprising:
    a transistor having a gate terminal supplied with an unbalanced input signal, and having a drain terminal and a source terminal which each produce one of a pair of balanced signals; and
    at least one inductance component connected between at least one of said drain terminal and said source terminal of said transistor and an earth conductor,
    wherein said inductance component has an inductance value that resonates with a capacitance difference between drain side parasitic capacitance and source side parasitic capacitance of said transistor.

11. The unbalance-to-balance converter as claimed in claim 10, wherein said inductance component is connected between said drain terminal and said earth conductor.

12. The unbalance-to-balance converter as claimed in claim 10, wherein said inductance component is connected between said source terminal and said earth conductor.

13. The unbalance-to-balance converter as claimed in claim 10, wherein said at least one inductance component consists of a first inductance component connected between said drain terminal and said earth conductor and a second inductance component connected between said source terminal and said earth conductor.

14. The unbalance-to-balance converter as claimed in claim 10, wherein a DC voltage applied to at least one of said drain and source is supplied through said inductance component.

15. A balanced mixer including an unbalance-to-balance converter, said unbalance-to-balance converter comprising:
    a transistor having a gate terminal supplied with an unbalanced input signal, and having a drain terminal and a source terminal which each produce one of a pair of balanced signals; and
    at least one reactance component connected between at least one of said drain terminal and said source terminal of said transistor and an earth conductor,
    wherein the reactance component of said unbalance-to-balance converter is a capacitance component having a capacitance value equal to a difference between drain side parasitic capacitance and source side parasitic capacitance.

16. A balanced mixer including an unbalance-to-balance converter, said unbalance-to-balance converter comprising:
    a transistor having a gate terminal supplied with an unbalanced input signal, and having a drain terminal and a source terminal which each produce one of a pair of balanced signals; and
    at least one reactance component connected between at least one of said drain terminal and said source terminal of said transistor and an earth conductor,
    wherein said reactance component of said unbalance-to-balance converter is an inductance component having an inductance value that resonates with a capacitance difference between drain side parasitic and source side parasitic capacitance of said transistor.

17. An unbalance-to-balance converter comprising:
    a transistor having a base terminal supplied with an unbalanced input signal, and having a collector terminal and an emitter terminal which each produce one of a pair of balanced signals; and
    at least one capacitance component connected between at least one of said collector terminal and emitter terminal of said transistor and an earth conductor,
    wherein said capacitance component has a capacitance value equal to a difference between collector side parasitic capacitance and emitter side parasitic capacitance.

18. The unbalance-to-balance converter as claimed in claim 17, wherein said capacitance component is connected between said emitter terminal and said earth conductor.

19. The unbalance-to-balance converter as claimed in claim 17, wherein said capacitance component is connected between said collector terminal and said earth conductor.

20. The unbalance-to-balance converter as claimed in claim 17, wherein said capacitance component is a variable capacitance device.

21. The unbalance-to-balance converter as claimed in claim 17, wherein said at least one capacitance component includes:
    a first capacitance component connected between said emitter terminal and said earth conductor; and
    a second capacitance component connected between said collector terminal and said earth conductor.

22. An unbalance-to-balance converter comprising:
    a transistor having a base terminal supplied with an unbalanced input signal, and having a collector terminal and an emitter terminal which each produce one of a pair of balanced signals; and
    at least one inductance component connected between at least one of said collector terminal and said emitter terminal of said terminal and an earth conductor,
    wherein said inductance component has an inductance value that resonates with a capacitance difference between collector side parasitic capacitance and emitter side parasitic capacitance.

23. The unbalance-to-balance converter as claimed in claim 22, wherein said inductance component is connected between said emitter terminal and said earth conductor.

24. The unbalance-to-balance converter as claimed in claim 22, wherein said inductance component is connected between said collector terminal and said earth conductor.

25. The unbalance-to-balance converter as claimed in claim 22, wherein said at least one inductance component includes:
    a first inductance component connected between said emitter terminal and said earth conductor; and
    a second inductance component connected between said collector terminal and said earth conductor.

26. A balanced mixer including an unbalance-to-balance converter, said unbalance-to-balance converter comprising:
    a transistor having a base terminal supplied with an unbalanced input signal, and having a collector terminal and an emitter terminal which each produce one of a pair of balanced signals; and at least one reactance component connected between at least one of said collector terminal and emitter terminal of said transistor and an earth conductor, wherein said reactance component is a capacitance component having a capacitance value equal to a difference between collector side parasitic capacitance and emitter side parasitic capacitance.

27. A balanced mixer including an unbalance-to-balance converter, said unbalance-to-balance converter comprising:

a transistor having a base terminal supplied with an unbalanced input signal, and having a collector terminal and an emitter terminal which each produce one of a pair of balanced signals; and at least one reactance component connected between at least one of said collector terminal and emitter terminal of said transistor and an earth conductor, wherein said reactance component is an inductance component having an inductance value that resonates with a capacitance difference between collector side parasitic capacitance and emitter side parasitic capacitance.

* * * * *